(12) United States Patent
Mouli

(10) Patent No.: US 7,235,468 B1
(45) Date of Patent: Jun. 26, 2007

(54) FINFET DEVICE WITH REDUCED DIBL

(75) Inventor: Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 11/201,038

(22) Filed: Aug. 10, 2005

Related U.S. Application Data

(62) Division of application No. 10/923,191, filed on Aug. 20, 2004, now Pat. No. 7,009,250.

(51) Int. Cl.
  H01L 21/425 (2006.01)
  H01L 21/336 (2006.01)
  H01L 21/38 (2006.01)

(52) U.S. Cl. .................. 438/514; 438/542; 438/558; 438/563; 438/197; 438/289; 257/E21.703

(58) Field of Classification Search ............... 438/514, 438/542, 558, 563, 197, 289, 217; 257/E21.703
See application file for complete search history.

(56) References Cited

U.S. PATENT DOCUMENTS

| | | | |
|---|---|---|---|
| 4,199,773 A | 4/1980 | Goodman et al. |
| 5,024,965 A | 6/1991 | Chang et al. |
| 5,112,766 A | 5/1992 | Fuji et al. |
| 5,164,805 A | 11/1992 | Lee |
| 5,166,765 A | 11/1992 | Lee et al. |
| 5,231,045 A | 7/1993 | Miura et al. |
| 5,315,144 A | 5/1994 | Cherne |
| 5,501,993 A | 3/1996 | Borland |
| 5,528,063 A | 6/1996 | Blanchard |
| 5,599,728 A | 2/1997 | Hu et al. |
| 5,614,433 A | 3/1997 | Mandelman |
| 5,930,630 A | 7/1999 | Hsheih et al. |
| 5,942,781 A | 8/1999 | Burr et al. |
| 5,960,275 A | 9/1999 | So et al. |
| 6,037,617 A | 3/2000 | Kumagai |
| 6,268,630 B1 | 7/2001 | Schwank et al. |
| 6,413,802 B1 | 7/2002 | Hu et al. |
| 6,503,783 B1 | 1/2003 | Mouli |
| 6,635,928 B2 | 10/2003 | Mouli |
| 6,716,682 B1 | 4/2004 | Mouli |

(Continued)

OTHER PUBLICATIONS

Park et al., "Dopant Redistribution in SOI during RTA: A Study on Doping in Scaled-down Si Layers", *IEEE*, 1999, pp. 14.2.1 through 14.2.4.

(Continued)

*Primary Examiner*—Walter Lindsay, Jr.
(74) *Attorney, Agent, or Firm*—Knobbe, Martens, Olson & Bear LLP

(57) ABSTRACT

FinFET devices formed with a Silicon On Insulator (SOI) technology with reduced Drain Induced Barrier Lowering (DIBL) characteristics and methods for producing the same. The methods involve dopant implants into the insulator layer, thereby creating borophosphosilicate glass (BPSG) diffusion sources within the insulation layer underlying the active regions of the SOI wafer. Backend high temperature processing steps induce diffusion of the dopants contained in the diffusion source into the active regions, thereby forming a retrograde dopant profile extending towards the channel region. The method can be selectively applied to selected portions of a wafer to tailor device characteristics, such as for memory cells.

9 Claims, 10 Drawing Sheets

U.S. PATENT DOCUMENTS

| | | |
|---|---|---|
| 6,872,640 B1 | 3/2005 | Mouli |
| 6,885,055 B2 | 4/2005 | Lee |
| 6,905,918 B2 | 6/2005 | Mouli |
| 6,921,963 B2 | 7/2005 | Krivokapic et al. |
| 6,921,982 B2 | 7/2005 | Joshi et al. |
| 6,953,726 B2 | 10/2005 | Nowak et al. |
| 6,963,114 B2 | 11/2005 | Lin |
| 6,992,354 B2 | 1/2006 | Nowak et al. |
| 2002/0089032 A1 | 7/2002 | Huang |
| 2005/0062088 A1 | 3/2005 | Houston |
| 2005/0077574 A1 | 4/2005 | Mouli |
| 2005/0087811 A1 | 4/2005 | Liao et al. |
| 2005/0093067 A1 | 5/2005 | Yeo et al. |

OTHER PUBLICATIONS

"A.1.3.2 Spurious Effects in Sub-Micron MOSFETs", http://www.iue.tuwien.ac.at/diss/schrom/diss/node90.html.

"2.7.2 Threshold Control", http://www.iue.tuwien.ac.at/diss/schrom/diss/node26.html.

"Random discrete dopant fluctuation; Ultra-thin channnel SOI", http://www.research.ibm.com/0.1um/pwong.html.

FINFET DEVICE WITH REDUCED DIBL

BACKGROUND OF THE INVENTION

This application is a divisional of U.S. patent application Ser. No. 10/923,191, filed Aug. 20, 2004, now U.S. Pat. No. 7,009,250, which is incorporated herein in its entirety by reference.

FIELD OF THE INVENTION

The invention relates to the field of semiconductor devices and fabrication processes and, in particular, to multi-gate vertical FinFET CMOS devices formed in a silicon-on-insulator (SOI) technology with improved avoidance of short channel effects, such as reduced drain induced barrier lowering (DIBL) and a method for fabricating the same.

DESCRIPTION OF THE RELATED ART

There is an ever-present desire in the semiconductor fabrication industry to achieve individual devices with smaller physical dimensions. Reducing the dimensions of devices is referred to as scaling. Scaling is desirable in order to increase the number of individual devices that can be placed on a given area of semiconductor material and the process yield and to reduce the unit cost and the power consumption of individual devices. In addition, scaling can result in performance increases of the individual devices as the charge carriers, having a finite velocity, have a shorter distance to travel and less bulk material has to accumulate or dissipate charges. Thus, the trend in the industry is towards thinner device regions and gate oxides, shorter channels, and lower power consumption.

However, scaling often creates some performance drawbacks. In particular, a known category of performance limitations known as short channel effects arises as the length of the channel of CMOS devices is reduced by scaling. One particular short-channel effect in CMOS devices, known as Drain Induced Barrier Lowering (DIBL), is significantly responsible for the degradation of sub-threshold swing in deep submicron devices. DIBL is a reduction in the potential barrier between the drain and source as the channel length shortens. When the drain voltage is increased, the depletion region around the drain increases and the drain region electric field reduces the channel potential barrier which results in an increased off-state or leakage current between the source and drain.

In planar CMOS devices, a retrograde channel dopant profile can be effectively used to control DIBL. In a CMOS process, n-type and p-type wells are created for NMOS and PMOS devices. In a conventional diffusion process, dopant concentration profiles in these n- and p-type wells are at a peak near the surfaces and decrease in the depth direction into the bulk as illustrated in FIG. 1. A retrograde profile is one in which the peak of the dopant concentration profile is not at the surface but at some distance into the bulk as shown in FIG. 2. Such retrograde profiles are helpful in deep submicron CMOS devices since they reduce the lowering of the source/drain barrier when the drain is biased high and when the channel is in weak inversion. This limits the amount of subthreshold leakage current flowing into the drain while maintaining the capacity for desired on-state current. A lower level of subthreshold leakage current provides improved circuit reliability and reduced power consumption.

A retrograde dopant profile also typically results in a lower dopant concentration near the surface of the wafer which reduces junction capacitances. Reduced junction capacitances allow the device to switch faster and thus increase circuit speed. Typically, retrograde profile dopant implants are done after formation of the gate. A halo (or pocket) implant is another known method used in deep submicron CMOS devices to reduce DIBL.

However in some applications, such as in an SOI process, it is difficult to create a retrograde profile due to the thinness of the silicon layer and the tendency of the dopants to diffuse. SOI processes employ a buried insulating layer, typically of silicon dioxide with a very thin silicon (Si) film (typically <1600 Å) overlying the oxide in which the active devices are formed. One difficulty encountered in SOI processes is that increasing the Si film thickness to facilitate forming a retrograde profile will increase the extent to which the devices formed therein get partially depleted. SOI devices also suffer from 'floating body' effects since, unlike conventional CMOS, in SOI there is no known easy way to form a contact to the bulk in order to remove the bulk charges.

Another difficulty is that when as-implanted retrograde dopant profiles diffuse during subsequent heat cycles in a process, they tend to spread out and lose their 'retrograde' nature to some extent. In SOI, since the silicon film is very thin, creating and maintaining a true retrograde dopant profile is very difficult. This is true even while using higher atomic mass elements like Indium (In) for NMOS and Antimony (Sb) as channel dopants. Diffusivity of these dopants in silicon is known to be comparable to lower atomic mass elements like boron (B) and phosphorus (P), when the silicon film is very thin, as in an SOI technology. Moreover, leakage current levels are known to increase when Indium is used for channel dopants (See "Impact of Channel Doping and Ar Implant on Device Characteristics of Partially Depleted SOI MOSFETs", Xu et al., pp. 115 and 116 of the Proceedings 1998 IEEE International SOI Conference, October, 1998 and "Dopant Redistribution in SOI during RTA: A Study on Doping in Scaled-down Si Layers", Park et al. IEDM 1999 pp. 337–340, incorporated herein by reference).

One device architecture that has been developed as an alternative to conventional planar CMOS while still achieving the benefits of scaling is known as a FinFET structure. A FinFET employs a vertically arranged structure or fin interposed between the source and drain where the channel is defined, typically with a multi-gate configuration. The advantages of the FinFET architecture include the ability to define device dimensions smaller than the photolithographic limit and the ability to easily access opposed sides of the channel to achieve a multi-gate structure. Such a multi-gate arrangement provides superior control over the gate of the device. A fully depleted silicon fin can be achieved with very low doping levels in the active region. However, short channel effects and effective control of threshold voltages still remains a challenge with the FinFET architecture.

From the foregoing it can be appreciated that there is an ongoing need for a method of fabricating deep submicron FinFET devices while reducing short channel effects such as DIBL and increasing device performance. There is a further need for reducing DIBL in deep submicron CMOS devices without incurring significant additional processing steps and high temperature processing.

SUMMARY OF THE INVENTION

The invention includes a vertically extending FinFET device with an underlying retrograde dopant profile region. A dopant diffusion source is implanted into a BOX layer of a SOI substrate. Subsequent high temperature processing, such as formation of a passivation layer, induces the dopants in the diffusion sources to out-diffuse into the active layer of the SOI substrate so as to create the retrograde profile region. The retrograde profile region provides a barrier to punch through and reduces other short channel effects such as DIBL. The retrograde profiles can be preferentially formed in a selected region of the SOI substrate to create an array of memory cells.

Thus, in one embodiment the invention is a method for creating semiconductor transistor devices on a silicon-on-insulator (SOI) structure including a buried oxide (BOX) layer, the method comprising implanting dopants such that the dopants come to reside within the BOX layer so as to create borophosphosilicate glass (BPSG) dopant diffusion sources within the BOX layer, forming vertically extending silicon fin structures, depositing a gate dielectric layer over the fin structures, forming source, drain, and gate regions, and processing the SOI structure so as establish retrograde dopant profiles underlying the fin structures having a peak concentration near the BOX.

In one embodiment, forming the vertically extending silicon fin structures comprises etching an epitaxial layer overlying the BOX layer via lithography and, in another, forming the vertically extending silicon fin structures comprises forming a mask layer overlying an epitaxial layer overlying the BOX layer, forming openings in the mask layer, and growing semiconductor material in the openings so as to form the fin structures. In the later embodiment, implanting of dopants is performed through the openings in the mask layer.

In one embodiment, forming the fin structure comprises forming opposed pillar structures and a fin interposed between and interconnecting the opposed pillar structures. Forming the gate regions can comprise depositing gate conductor material on the fin over the gate dielectric so as to define multiple gate regions on at least two opposed sides of the fin and so as to define a channel region interposed between the pillar structures.

In one embodiment, processing the SOI structure so as establish a retrograde dopant profile comprises forming a passivation layer with attendant high temperature exposure to the SOI structure. In one embodiment, the method is preferentially applied to a selected portion of the SOI structure so as to form an array of memory cells. In one embodiment, implanting dopants so as to create the dopant diffusion sources; forming source, drain, and gate regions; and processing the SOI structure so as establish the retrograde dopant profiles underlying the fin structures is performed in a complementary manner so as to create complementary transistor devices.

Another embodiment is a semiconductor transistor device comprising a semiconductive substrate, an insulator layer buried within the semiconductive substrate, an active layer of semiconductive material above the insulator layer arranged as a vertically extending structure with opposed source and drain pillars and a fin interposed therebetween, a multi-gate structure formed around the fin so as to define a channel region interposed between the source and drain pillars, and a dopant diffusion source positioned within the buried insulator layer underlying the vertically extending structure wherein the dopant diffusion sources are diffused upwards so as to create a retrograde dopant profile in the active layer underlying the fin.

In one embodiment, the vertically extending structure of semiconductive material above the insulator layer comprises a layer of epitaxial silicon and/or the dopant diffusion source is self-aligned with the vertically extending structure.

One embodiment further comprises a passivation layer overlying the vertically extending structure and formed so as to induce the diffusion of the dopant diffusion source so as to create the retrograde dopant profile. In one embodiment, the retrograde dopant profile has a peak concentration substantially adjacent the interface of the BOX and the active layer.

In one embodiment, the retrograde dopant profile provides the transistor device with improved resistance to drain-induced barrier lowering (DIBL) and/or provides the transistor device with recombination centers to reduce floating body effects in the transistor device. These and other objects and advantages of the present invention will become more fully apparent from the following description taken in conjunction with the accompanying drawings.

DETAILED DESCRIPTION OF THE PREFERRED EMBODIMENT

Figure 2:
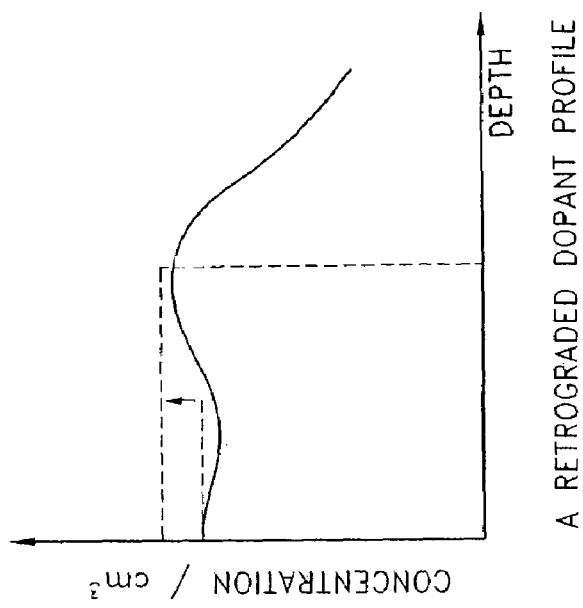
FIG. 2 is a graph illustrating prior art of a retrograde dopant profile in CMOS devices.
Figure 1:
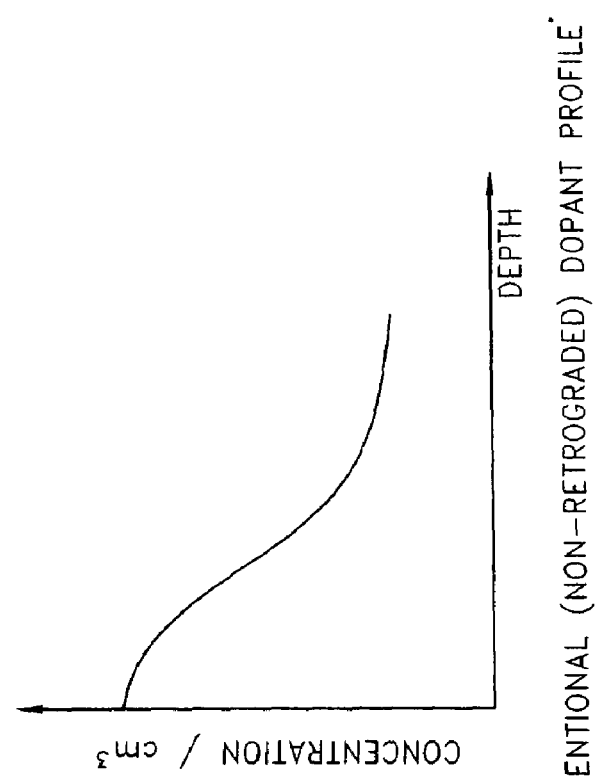
FIG. 1 is a graph illustrating prior art of a typical diffusion based dopant profile in CMOS devices.
Figure 3:
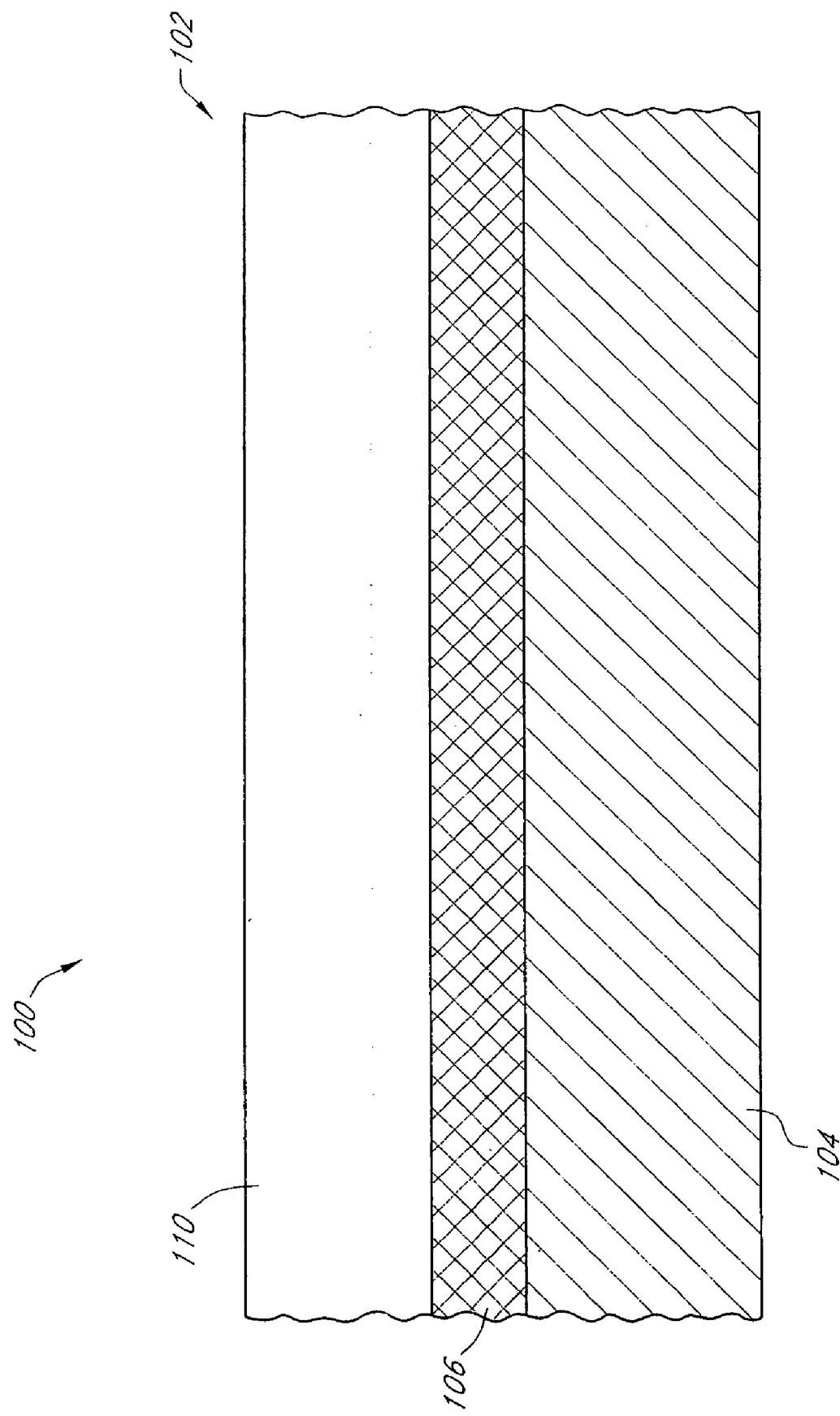
FIG. 3 is a section view of the starting material of the FinFET with reduced DIBL, a SIMOX wafer.

Reference will now be made to the drawings wherein like numerals refer to like structures throughout. FIG. 3 is a section view of one embodiment of forming a FinFET with reduced DIBL 100 of the invention showing the starting SOI material, in this embodiment a Separation by IMplanted OXygen (SIMOX) wafer 102. The SIMOX wafer 102 is well known in the art and comprises a silicon substrate 104 in which a layer of the substrate 104 is converted to a buried silicon dioxide (BOX) layer 106 with a heavy oxygen implant and subsequent anneal. An epitaxial layer 110 of Si approximately 500 Å to 2500 Å thick is then grown on top of the BOX layer 106. The BOX layer 106 of the SIMOX wafer 102 provides electrical insulation between the active region of the epitaxial layer 110 and the bulk silicon of the substrate 104. Thus, active devices formed in the epitaxial layer 110 are electrically isolated from the semiconductive substrate 104. The SIMOX wafer 102 also provides physical structure as well as reactive material for formation of the FinFET with reduced DIBL 100 in a manner that will be described in greater detail below.

The description of the FinFET with reduced DIBL 100 that follows can apply to combined CMOS FinFET structures comprising PMOS FinFETs and NMOS FinFETs, PMOS FinFETs or NMOS FinFETs alone, or other technologies employing the methods herein described without detracting from the spirit of the invention. It should also be understood that FIGS. 3–11 are illustrative of embodiments of various processes and resulting structures of the invention and should not be interpreted as being to scale.

Figure 4:
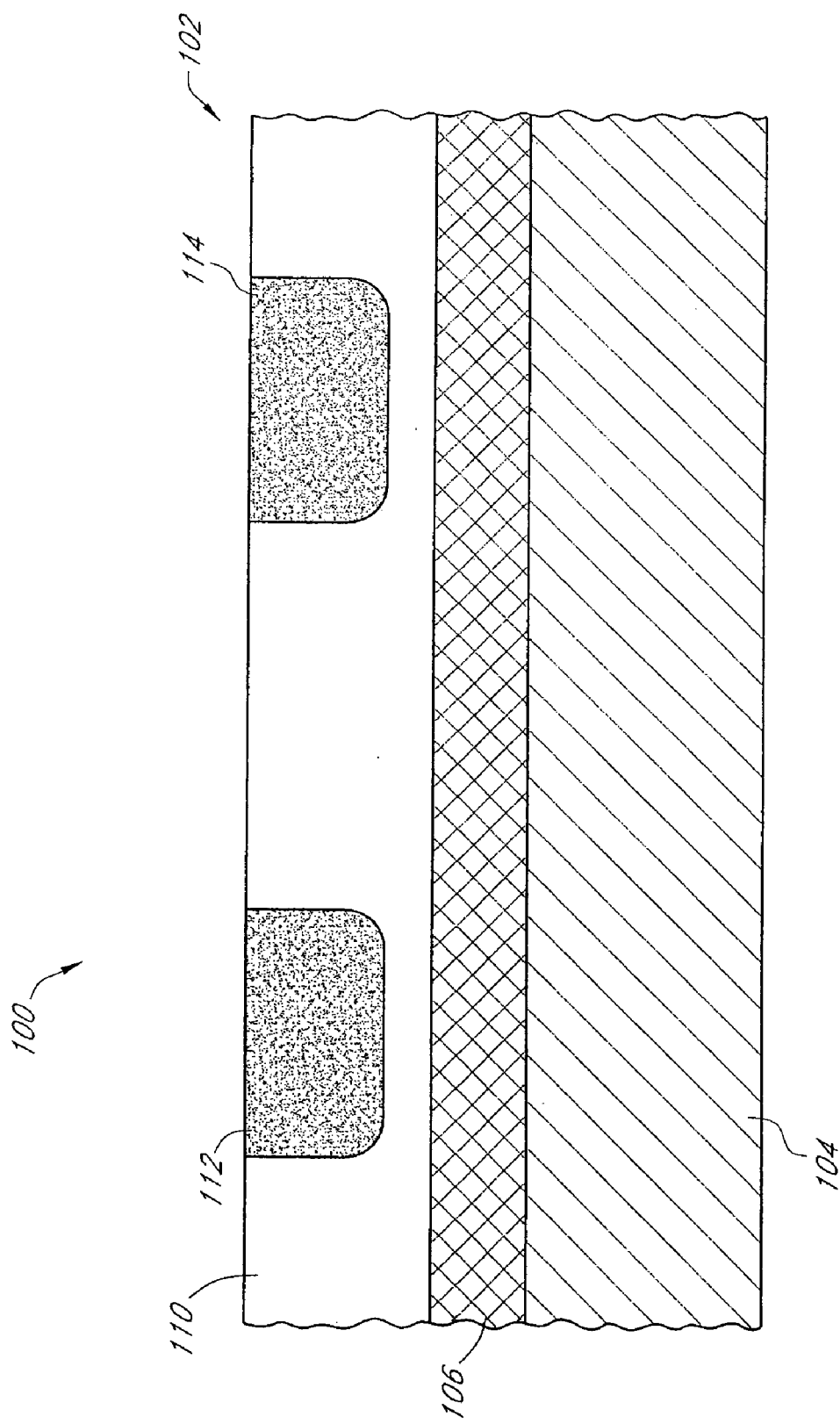
FIG. 4 is a section view of the SIMOX wafer of FIG. 4 with n- and p-type wells formed in the epitaxial layer.
Figure 10:
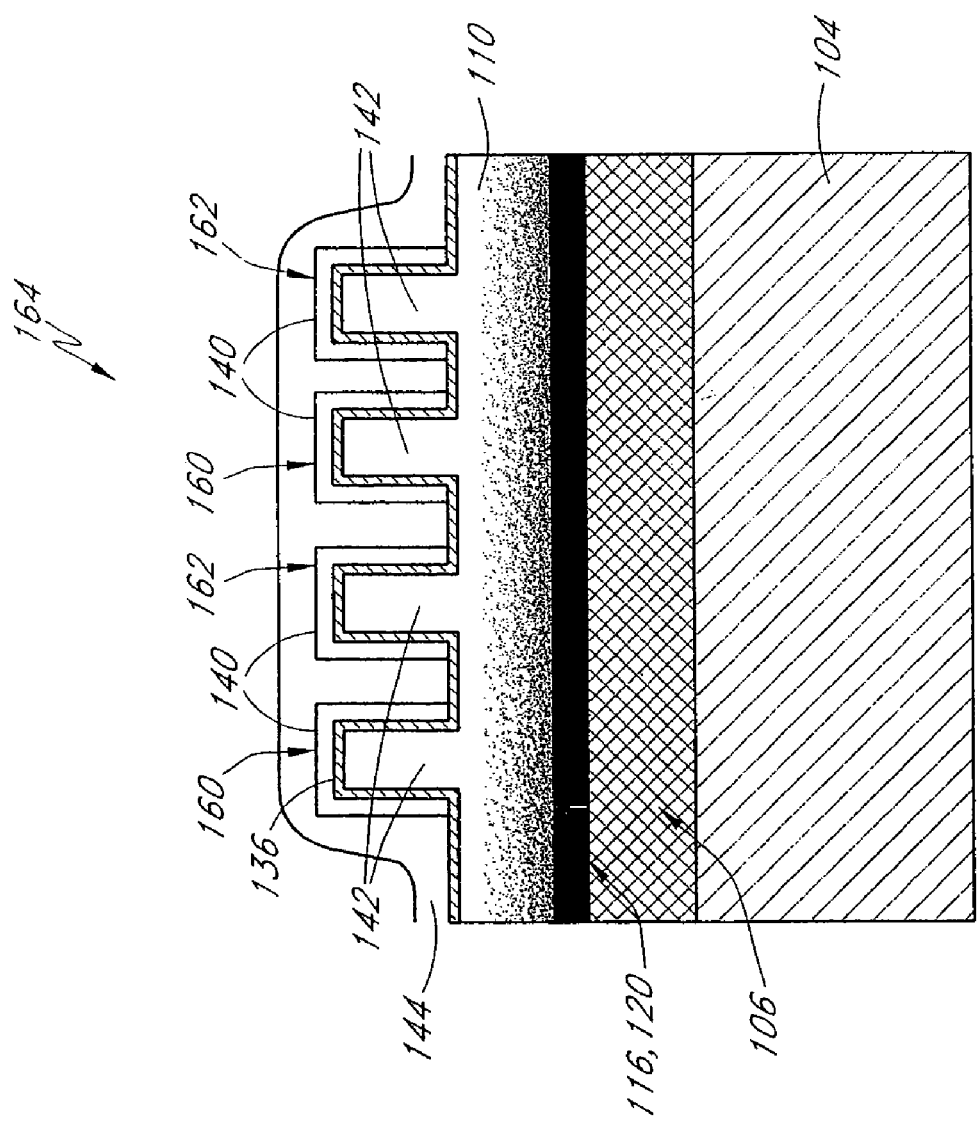
FIG. 10 is a side view of the vertically extending silicon structure with source, drain, and gate regions defined and provided with a passivation layer so as to define a FinFET with reduced DIBL and showing a retrograde dopant profile region.

In one embodiment, a method of forming the FinFET with reduced DIBL 100 also comprises creating n-well 112 and p-well 114 regions as shown in FIG. 4. The n-well 112 and p-well 114 regions are created, in this embodiment, by implanting a dose of approximately 1e13/cm$^2$ of P @ 60 keV to create the n-well 112 and a dose of approximately 1e13/cm$^2$ of B @ 30 keV to create the p-well 114. The n-well 112 and p-well 114 are then driven at a temperature of approximately 800° C. for a period of approximately 30 minutes. The n-well 112 and p-well 114 provide regions for the subsequent formation of PMOS 162 and NMOS 160 FinFET devices that comprise a CMOS FinFET 164 embodiment (FIG. 10).

Figure 5:
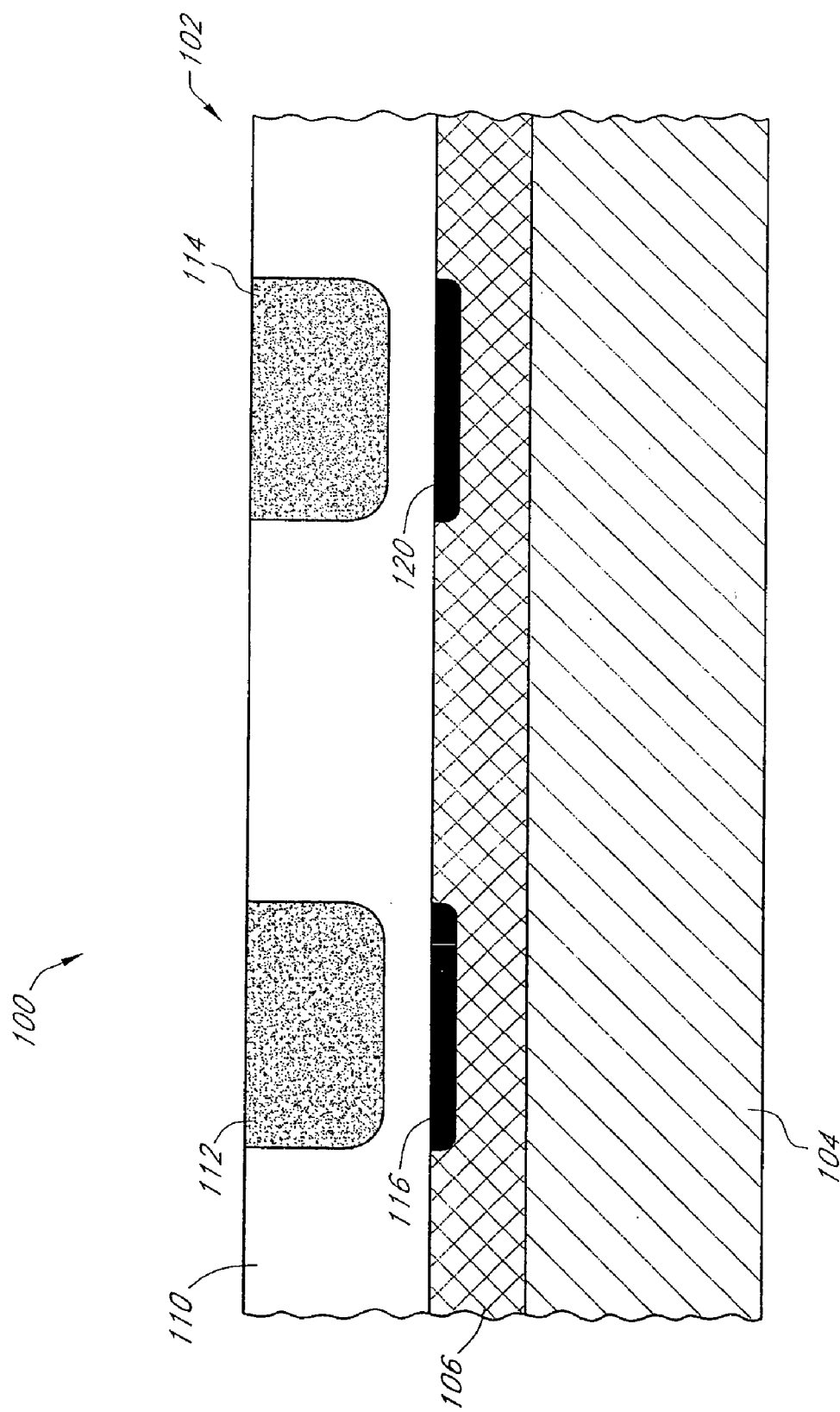
FIG. 5 is a section view of the SIMOX wafer with dopant diffusion sources formed under the n- and p-type wells in the BOX layer.

This embodiment of forming the FinFET with reduced DIBL 100 also comprises relatively high energy, high dose n-type diffusion source 116 and p-type diffusion source 120 implants into and through the p-well 114 and n-well 112 respectively as shown in FIG. 5. The n-type diffusion source 116 and p-type diffusion source 120 comprise borophosphosilicate glass (BPSG). The n-type diffusion source 116 and p-type diffusion source 120 implant parameters should be tailored in such a way that the resultant n-type diffusion source 116 and p-type diffusion source 120 dopant profiles mainly reside in the BOX layer 106 and extend substantially adjacent the interface with the epitaxial layer 110. In one embodiment, the n-type diffusion source 116 implant comprises an implant of arsenic through the n-well 112 of approximately 1.0e14–2.0e15/cm$^2$ @ approximately 5–30 keV into the BOX layer 106 and the p-type diffusion source 120 implant comprises an implant of boron through the p-well 114 of approximately 1.0e14–2.0e15/cm$^2$ @ approximately 5–30 keV into the BOX layer 106. In this embodiment, the final n-type diffusion source 116 and p-type diffusion source 120 dopant concentrations in the BOX 106 are preferably approximately $1.0^{18}$–$1.0^{20}$/cm$^3$ inside the BOX 106. As will be described in greater detail below, the diffusion sources 116, 120 provide a source of dopant atoms that can diffuse into the wells 112, 114 respectively to create a retrograde dopant profile.

Figure 6:
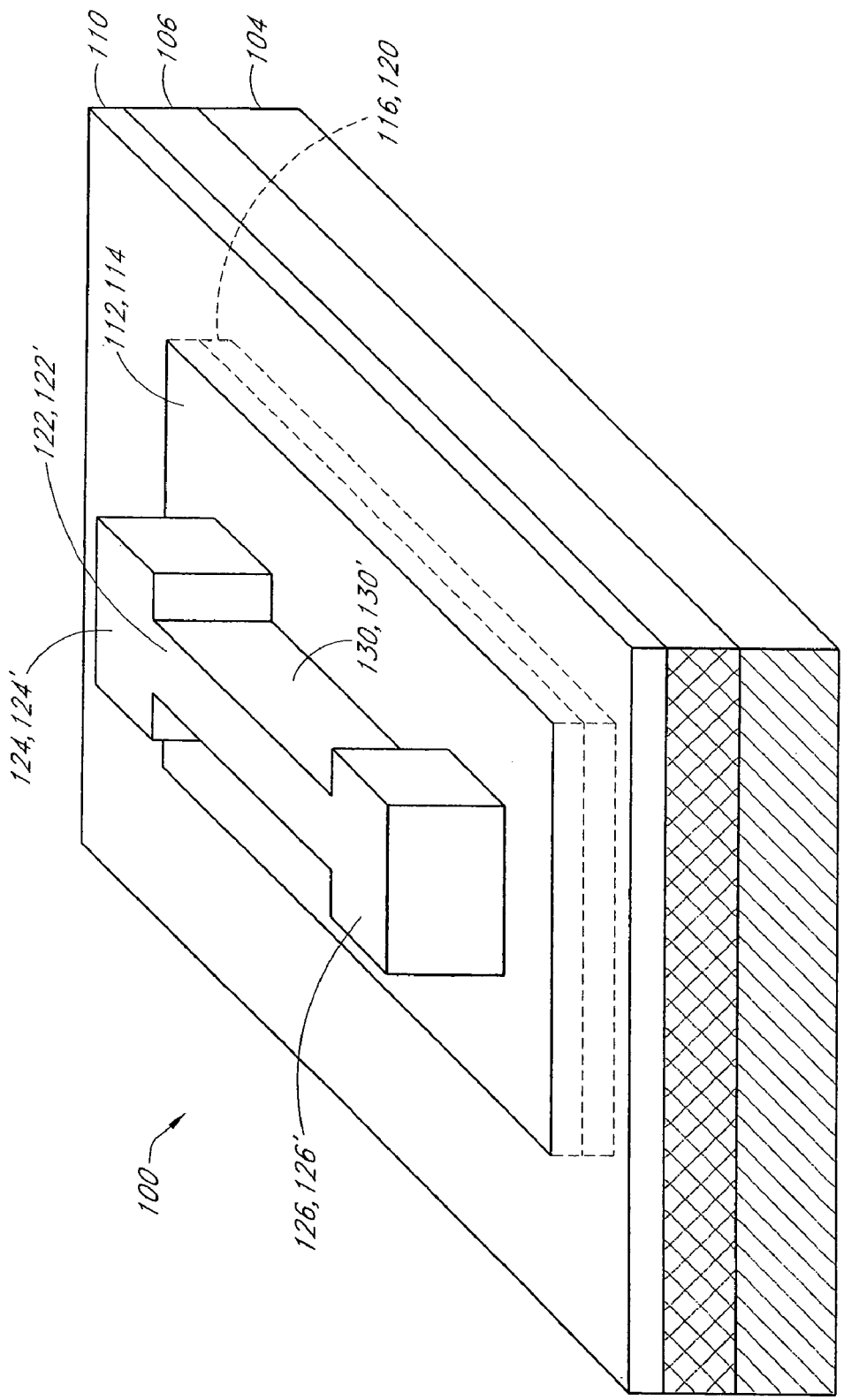
FIG. 6 is a perspective view of one embodiment of vertically extending silicon structure with a fin interposed between two pillars.

FIG. 6 illustrates a step in one embodiment of formation of the FinFET with reduced DIBL 100 wherein the epitaxial layer 110 is etched to create a fin structure 122. The fin structure 122 extends generally vertically from the horizontally extending plane of the SIMOX wafer 102 and comprises opposed pillar structures of epitaxial silicon which will define a drain region 124 and a source region 126. A generally fin shaped and vertically extending fin region 130 is interposed between and interconnects the drain region 124 and source region 126. In one embodiment, the fin region 130 is formed by etching the silicon of the epitaxial layer 110 such as by conventional photolithography or spacer defined photolithography. An alternative embodiment of forming the fin structure is also possible and will be described in greater detail below with reference to FIG. 7 with the alternative embodiment of the formation of the fin structure indicated as 122'. The corresponding alternative embodiments of the drain, source, and gate regions are indicated as 124', 126', and 130', respectively.

Figure 7:
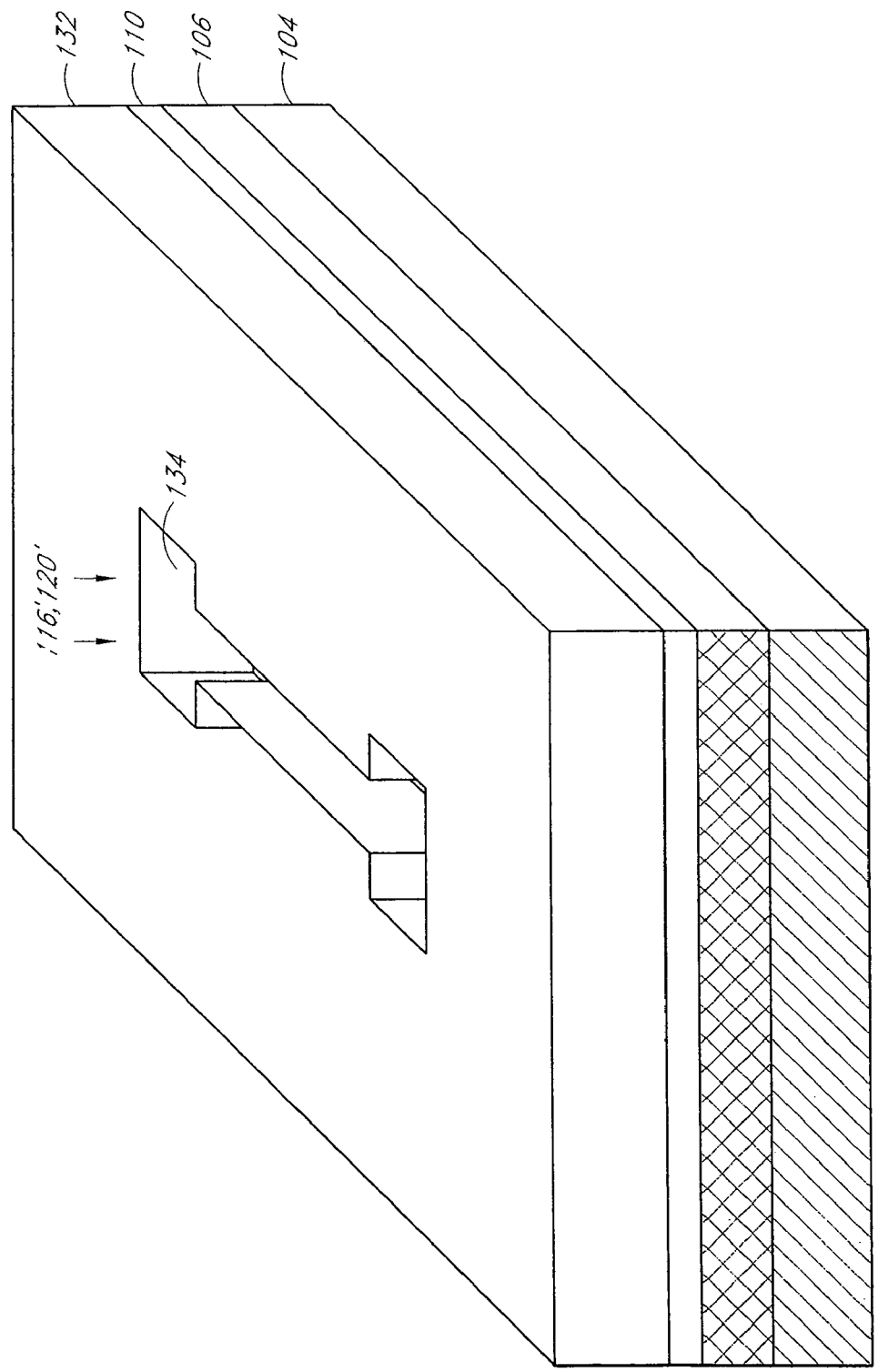
FIG. 7 is a perspective view of an alternative embodiment of forming a vertically extending silicon structure with a fin interposed between two pillars via a hard mask layer with an opening.

One alternative embodiment to formation of the fin structure 122' is to place a hard mask layer 132 on the epitaxial layer 110 and in this embodiment the hard mask layer 132 comprises silicon nitride. Openings 134 are formed in the hard mask layer 132 corresponding to the desired footprint for the fin structure 122'. Additional epitaxial silicon is then grown in the openings 134 and the hard mask layer 132 is then removed so as to leave the fin structures 122'. A further alternative embodiment is also illustrated in FIG. 7 wherein an n-type and a p-type diffusion source 116', 120', respectively, are implanted through the opening 134 in the hard mask layer 132. This embodiment provides a more tailored self-aligned location and positioning for the n-type and p-type diffusion sources 116', 120' in the BOX layer 106. The implantation parameters for the n-type and p-type diffusion sources 116', 120' are substantially as previously described for the n-type and p-type diffusion sources 116, 120.

Figure 8:
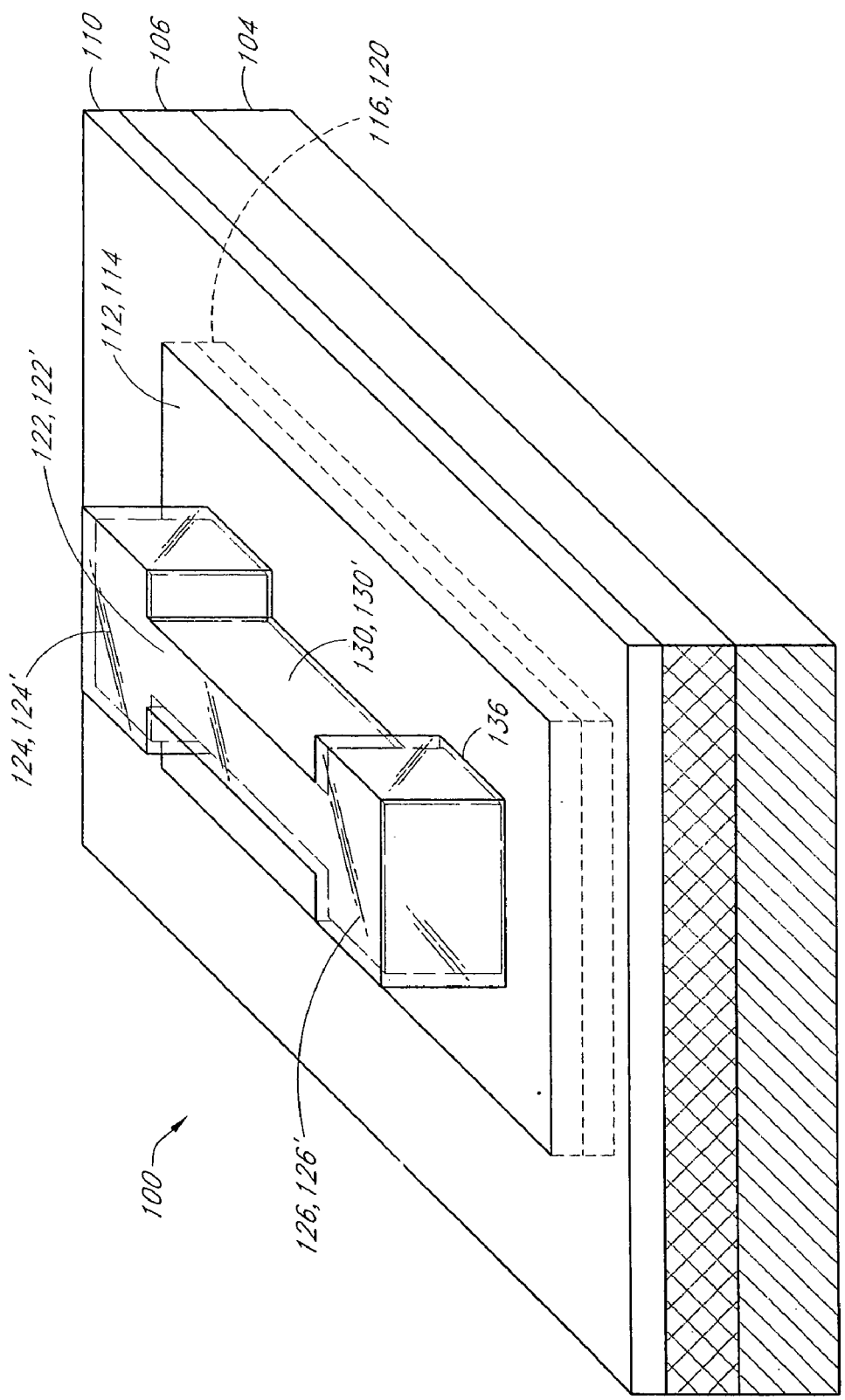
FIG. 8 is a perspective view of the vertically extending silicon structure of FIG. 6 or 7 with a gate dielectric layer.
Figure 9:
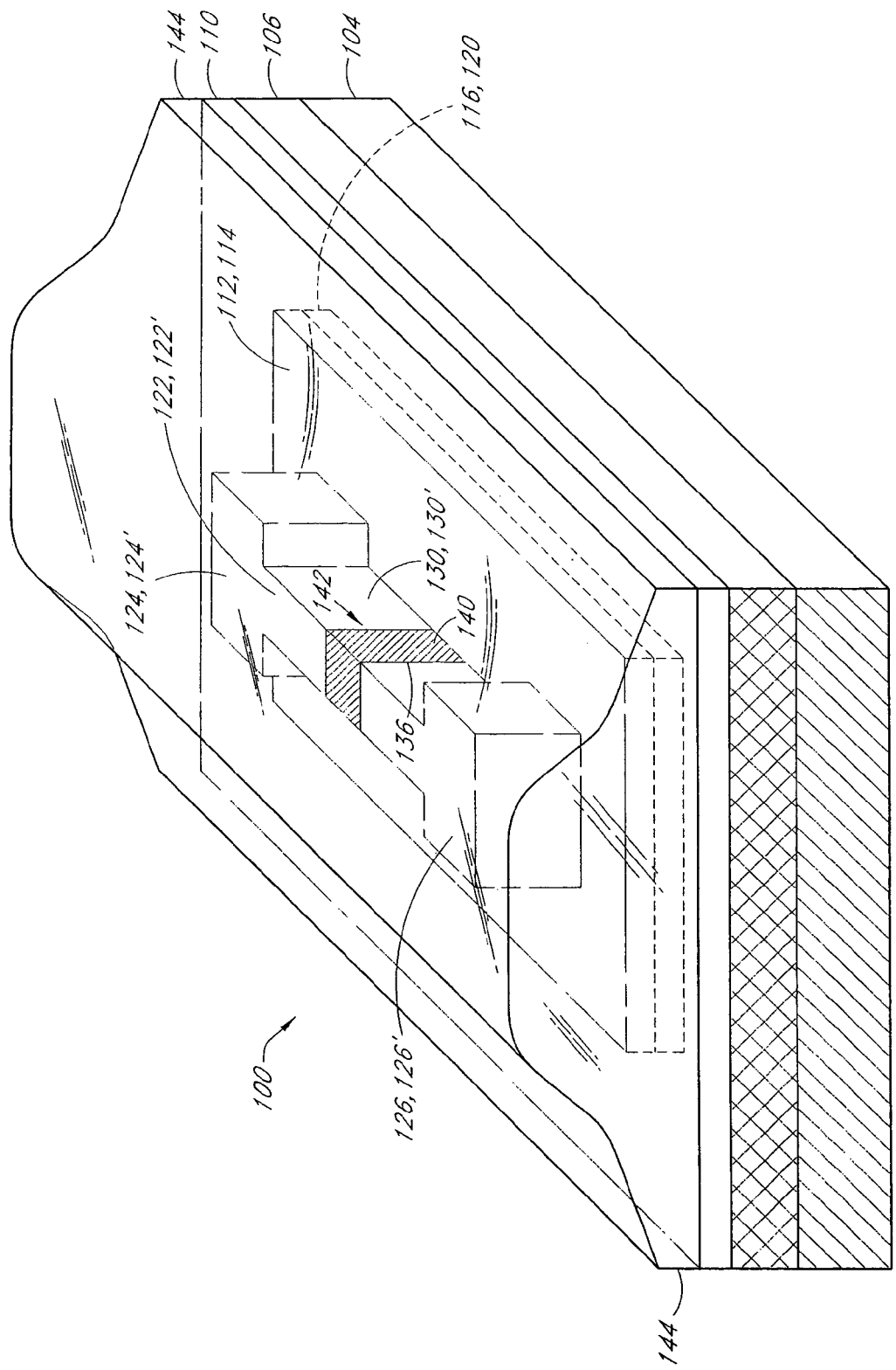
FIG. 9 is a perspective view of the vertically extending silicon structure with source, drain, and gate regions defined and provided with a passivation layer so as to define a FinFET with reduced DIBL.

Following formation of the fin structure 122, 122', as illustrated in FIG. 8, a gate dielectric 136 is deposited or grown to cover the fin structure 122, 122'. In various embodiments, the gate dielectric 136 comprises silicon dioxide or other relatively high K materials such as hafnium oxide, aluminum oxide, tantalum pentoxide, zirconium oxide, etc. Following placement of the gate dielectric 136, a gate conductor 140 is formed on the fin region 130 so as to define a channel region 142 for the FinFET with reduced DIBL 100. In this embodiment, the gate conductor 140 comprises a gate polysilicon deposited in a known manner. The placement of the gate conductor 140 around the vertically extending fin region 130 creates a multi-gate architecture as the gate conductor 140 is positioned on opposed sides of the channel region 142 defined thereby.

Known processes would then be performed to form, activate, and establish higher level circuit electrical contact with the drain 124 and source 126 regions including formation of a passivation layer 144. In this embodiment, the passivation layer 144 comprises a layer of oxide, BPSG, or polysilicon approximately 3000 Å thick formed in a known manner. The formation of the passivation layer 144 involves relatively high temperature processing.

During the high temperature processing attendant formation of the passivation layer 144, the n-type diffusion source 116 and the p-type diffusion source 120 previously implanted into the BOX layer 106 serve as solid-sources for dopant diffusion. When the passivation layer 144 is formed on the SIMOX wafer 102 with the attendant high temperature, the dopants contained in the n-type 116 and the p-type 120 diffusion sources out diffuse upwards into the epitaxial silicon 110, creating a relatively thin, highly doped retrograde dopant profile region 146 as shown in FIG. 10. In the case of the p-well 114, the retrograde profile region 146 will comprise boron and, in the n-well 112, the retrograde profile region 146 will comprise arsenic.

The retrograde profile region 146 will act as a punch through prevention layer to control DIBL. The retrograde profile region 146 will also reduce the junction capacitance of the FinFET with reduced DIBL. The dopants contained within the retrograde profile region 146 will also create recombination centers near the BOX 106/silicon substrate 104 interface. These recombination centers are an added benefit in the FinFET with reduced DIBL 100 since the recombination centers tend to reduce the floating body effects in the FinFET with reduced DIBL 100.

Hence, the process of the illustrated embodiment provides a method in which a retrograde doping profile 146 can be created in thin semiconductor active areas such as the active areas used in silicon-on-insulator (SOI) applications including the channel region 142 of a FinFET device 100. The processes of the illustrated embodiments do not significantly add to the processing of the device 100 as only discrete implantation steps are required and the diffusion is obtained through thermal processing of the device 100 which occurs as part of previously known processing steps. Thus, retrograde profile regions 146 can be created in a manner that does not significantly increase the processing costs of the device 100.

Figure 11:
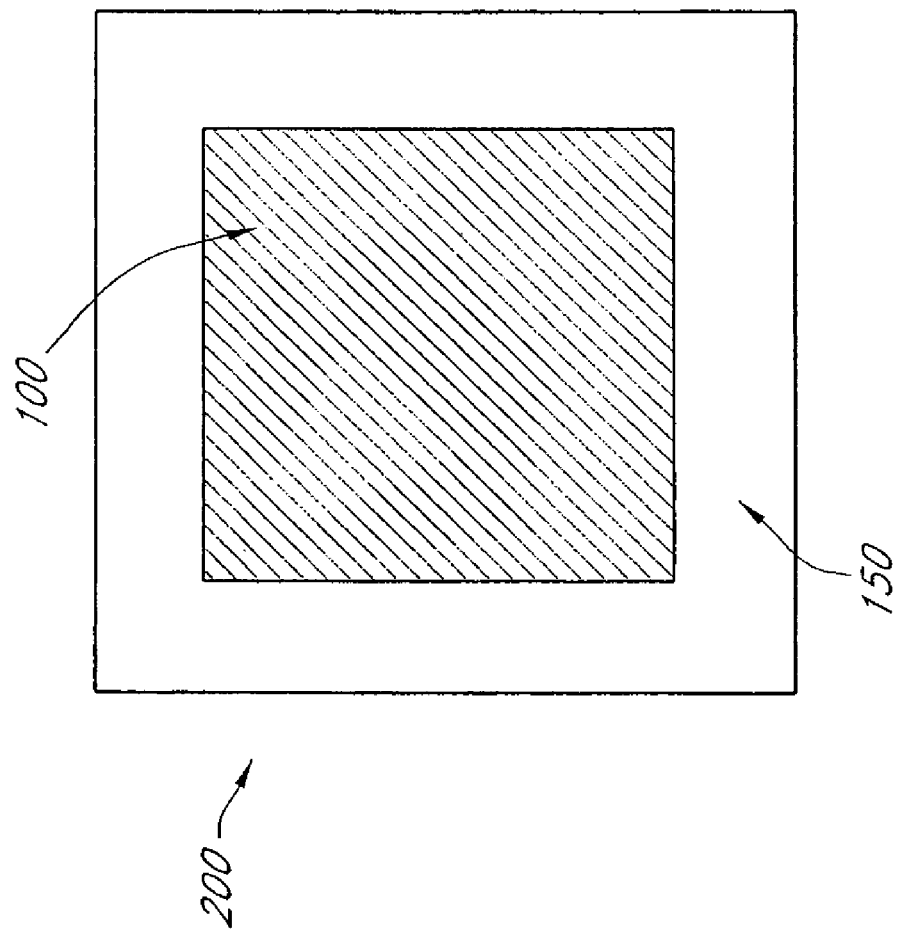
FIG. 11 is a top view of an array of memory cells, such as DRAM cells, with peripherally disposed logic circuits.

FIG. 11 is a top view of another embodiment of the invention. In particular, FIG. 11 is a top view of a memory array 200, such as DRAM cells comprising the FinFET with reduced DIBL devices 100 previously described surrounded with a peripheral array of logic circuits 150. A typical DRAM memory cell comprises a single transistor, such as an NMOS, and a storage capacitor interconnected in a well known circuit. The gate of the transistor is typically connected to a word line and the source or drain of the transistor is connected to a bit line. The peripheral logic circuits 150 provide the access for read and write operations to the individual DRAM cells. A particular advantage of DRAM memory is that the DRAM memory cell is simple and compact and results in high memory density per unit area. DRAM circuits are typically near the leading edge of technology as scaling reduces device size. Thus, DRAM is an application that is particularly demanding for limiting short channel effects, such as DIBL.

As previously described, the invention can be utilized solely for NMOS devices and FIG. 11 shows an embodiment of such an application to the memory array 200. In particular, FIG. 11 shows the inner array of FinFET NMOS with reduced DIBL 100 formed preferentially as previously described. In this embodiment, the peripheral logic circuits 150 are masked or otherwise formed with conventional processes to provide logic access to the inner array of FinFET devices 100. In other embodiments, the processing innovations described herein can be applied to the entire array 200.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method for creating semiconductor transistor devices on a silicon-on-insulator (SOI) structure including a buried oxide (BOX) layer, the method comprising:
   implanting dopants such that the dopants come to reside within the BOX layer so as to create borophosphosilicate glass (BPSG) dopant diffusion sources within the BOX layer;
   forming vertically extending silicon fin structures;
   depositing a gate dielectric layer over the fin structures;
   forming source, drain, and gate regions; and
   processing the SOI structure so as establish retrograde dopant profiles underlying the fin structures having a peak concentration near the BOX.

2. The method of claim 1, wherein forming the vertically extending silicon fin structures comprises etching an epitaxial layer overlying the BOX layer via lithography.

3. The method of claim 1, wherein forming the vertically extending silicon fin structures comprises:
   forming a mask layer overlying an epitaxial layer overlying the BOX layer;
   forming openings in the mask layer; and
   growing semiconductor material in the openings so as to form the fin structures.

4. The method of claim 3, wherein the implanting of dopants is performed through the openings in the mask layer.

5. The method of claim 1, wherein forming the fin structure comprises forming opposed pillar structures and a fin interposed between and interconnecting the opposed pillar structures.

6. The method of claim 5, wherein forming the gate regions comprises depositing gate conductor material on the fin over the gate dielectric so as to define multiple gate regions on at least two opposed sides of the fin and so as to define a channel region interposed between the pillar structures.

7. The method of claim 1, wherein processing the SOI structure so as to establish a retrograde dopant profile comprises forming a passivation layer with attendant high temperature exposure to the SOI structure.

8. The method of claim 1, wherein the method is preferentially applied to a selected portion of the SOI structure so as to form an array of memory cells.

9. The method of claim 1, wherein implanting dopants so as to create the dopant diffusion sources; forming source, drain, and gate regions; and processing the SOI structure so as to establish the retrograde dopant profiles underlying the fin structures is performed in a complementary manner so as to create complementary transistor devices.

* * * * *

UNITED STATES PATENT AND TRADEMARK OFFICE
CERTIFICATE OF CORRECTION

| | |
|---|---|
| PATENT NO. | : 7,235,468 B1 |
| APPLICATION NO. | : 11/201038 |
| DATED | : June 26, 2007 |
| INVENTOR(S) | : Chandra V. Mouli |

It is certified that error appears in the above-identified patent and that said Letters Patent is hereby corrected as shown below:

On the title page, item [54]; and column 1, line 1
<u>IN THE TITLE</u>

Line 1 delete "FINFET" and insert -- FinFET --, therefor.

<u>Page 2, Column 2 (Other Publications)</u>

Line 5 delete "channnel" and insert -- channel --, therefor.

<u>Column 1</u>

Line 1 delete "FINFET" and insert -- FinFET --, therefor.

<u>Column 4</u>

Line 44 delete "FIG." and insert -- FIGS. --, therefor.

Line 64-65 delete "IMplanted OXygen" and insert -- Implanted Oxygen --, therefor.

<u>Column 6</u>

Line 62 delete "out diffuse" and insert -- outdiffuse --, therefor.

UNITED STATES PATENT AND TRADEMARK OFFICE
CERTIFICATE OF CORRECTION

PATENT NO. : 7,235,468 B1
APPLICATION NO. : 11/201038
DATED : June 26, 2007
INVENTOR(S) : Chandra V. Mouli It is certified that error appears in the above-identified patent and that said Letters Patent is hereby corrected as shown below:

<u>Column 7</u>

Line 1-2 delete "punch through" and insert -- punchthrough --, therefor.

Signed and Sealed this

Third Day of June, 2008

JON W. DUDAS
*Director of the United States Patent and Trademark Office*